May 22, 1962 W. GREATBATCH 3,036,274
COMPENSATED BALANCED TRANSISTOR AMPLIFIERS
Filed Jan. 6, 1958
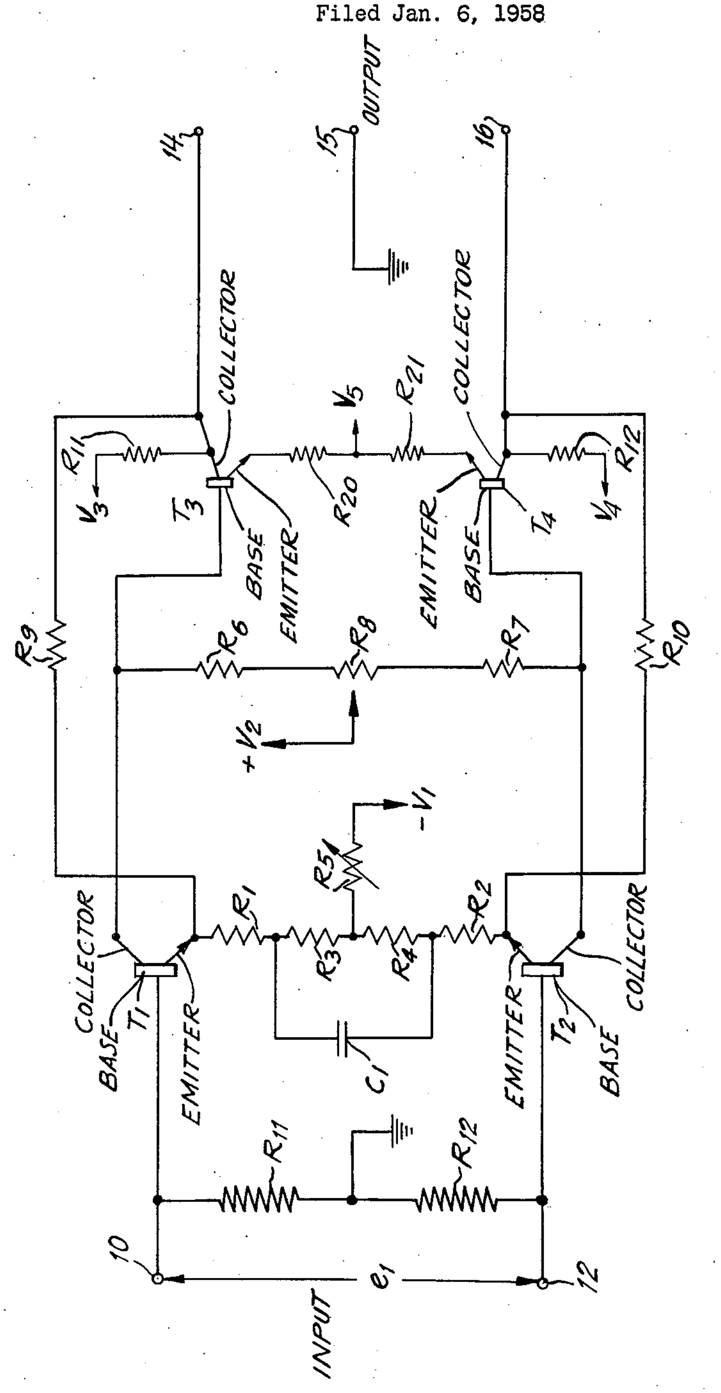

United States Patent Office 3,036,274

Patented May 22, 1962

3,036,274

COMPENSATED BALANCED TRANSISTOR AMPLIFIERS

Wilson Greatbatch, Clarence, N.Y., assignor to Taber Instrument Corporation, North Tonawanda, N.Y., a corporation of New York Filed Jan. 6, 1958, Ser. No. 707,230
12 Claims. (Cl. 330—15)

This invention relates generally to balanced semi-conductor amplifiers and more particularly to compensated transistor high gain amplifiers which are stable over wide ranges of environmental conditions.

Amplifiers utilizing transistors or semi-conductor elements are well known in the art. It is also well known that the parameters of presently available transistors or semi-conductor amplifiers are subject to variation due to changes in temperature and other environmental conditions.

The factors causing drift or instability in transistor amplifiers due to the aforementioned changes in temperature and other environmental changes are changes in parameters of the transistor itself. For example, the collector cut-off current increases logarithmically with temperature. This in effect causes the diode junction back-resistance of the transistor on the collector side to become lower. Thus, more current flows through the transistor, increasing the voltage drop across the load resistor, thereby lowering the operating point of the transistor. Changes in temperature cause other transistor parameters to change, such as current amplification factor and the emitter, base and collector resistances. The effect of temperature change produces the same effect as a change in the collector cut-off current. That is, the quiescent voltage at the collector of the transistor is lowered. In addition to changes taking place in the transistor parameters themselves, other circuit elements such as resistors are sensitive to extreme changes in environmental temperatures. Where power is supplied by batteries, their output voltage varies with temperature, condition of charge, and age which causes a shift in the operating characteristics of the transistor. Still another consideration is the variation of the transistor parameters between units of the same manufacturer type designation. These variations have deleterious effects on the linearity and stabiltiy of the amplifier circuits especially those which are called upon to perform functions of a quantitative nature in measuring systems. In the case where multiple stages of amplification are required to obtain sufficient amplification, the effects of variations in the various parameters are multiplied by each succeeding stage.

It is accordingly an object of the present invention to provide a semi-conductive amplifier of the balanced or symmetrical type which is relatively unaffected by temperature and other changes in environmental conditions.

Another object of this invention is to provide a balanced semi-conductor amplifier having a stabilized operating point.

Still another object of this invention is to provide a balanced transistor amplifier whose operating point is stabilized by the utilization of a novel method of feedback.

A further object is to provide a balanced high gain transistor amplifier wherein the operating points of individual transistors of an input stage are automatically adjusted by the D.C. voltage level of the corresponding transistor in the output stage.

A still further object is to provide a balanced high gain transistor amplifier wherein a novel method of D.C. feedback is used to stabilize the operating point of individual transistors of the input pair with the voltage level of the corresponding transistor of the output pair independently without affecting the overall operation of the balanced amplifier, while lesser amounts of A.C. feedback are applied to regulate the A.C. gain of the amplifier and maintain good in-phase rejection.

In carrying out the invention, an input stage is provided of the balanced or symmetrical emitter coupled type to drive a succeeding amplifier stage or stages. The D.C. voltage of the output stage is sensed and any deviations in this voltage are fed back to the input stage in such a manner that the D.C. output voltage is restored to its former value by means of the D.C. gain of the amplifier. Sufficient D.C. voltage feedback is utilized to provide operating point stability by the servoing of the operating point of each individual input stage transistor of the output stage.

In addition to the heavy D.C. voltage feedback, a lesser amount of A.C. feedback is applied to the input stage in such a manner as to regulate the A.C. gain of the amplifier, and maintain good in-phase rejection.

Amplifiers of this type are relatively insensitive to input signals which are applied simultaneously to both inputs, but are sensitive to input signals which are applied between the two inputs. Or, stating it in another way, the amplifier amplifies the difference between the two inputs. The ability of the amplifier to distinguish between a signal applied to both inputs and to signals applied between the inputs is known as "the common-mode rejection ratio." In carrying out the invention, compensation of the amplifier has been accomplished without impairing the common-mode rejection ratio.

The nature of the invention and its various features and objects will appear more fully and be understood from consideration of the following description when read in connection with the accompanying drawing in which a circuit diagram of a balanced amplifier embodying the invention is shown.

Referring now to the drawing, it can be seen that the upper portion of the amplifier is the mirror image or is symmetrical with the lower portion. Considering the drawing in detail, there are shown semi-conductor devices or transistors T1 and T2. Although transistors T1 and T2 are drawn with symbols identifying them to be of the NPN type, the invention operates just as well with PNP type transistors. Of course, changes in emitter and collector potentials will have to be made as is apparent to those skilled in the art. The emitters, base and collector of the transistors T1 and T2 have been appropriately labeled in the figure. It is seen that transistors T1 and T2 are connected in the grounded-emitter connection. Input terminal 10 is connected to base of transistor T1 whose output is taken across resistor R6 connected to the collector and fed to the base of transistor T3 which is the input of the upper portion of the output stage, said transistor connected in the grounded emitter configuration well known in the art.

Although only one output stage in which the upper portion is the mirror image symmetrical with the lower portion is shown in the drawing, additional amplifier stages may be connected between the input and output stages depending upon the amount of amplification desired. Resistor R6 is connected to a positive source of unidirectional potential plus V2 through the center tap of the potentiometer R8. The emitter of transistor T1 is connected to the negative source of potential V1 through the resitsors R1, R3 and the variable resistor R5.

Input terminal 12 is similarly connected to the base of the transistor T2. The output of transistor T2 is taken across resistor R7 which is connected to the collector and similarly supplies the input signal to the base of transistor T4 which is the input of the lower portion of the output stage said transistor connected in the grounded emitter configuration well known in the art. Resistor R7 is in turn connected to the positive voltage source V2 through the center tap of potentiometer R8. The emitter of transistor T2 is connected to the negative source of potential V1 through the resistors R2, R4, and the common variable resistor R5.

Capacitor C1, the function of which is to be described hereinafter is connected across resistors R3 and R4.

Resistors R9 and R10 are feedback resistors having one end connected between the corresponding outputs of the additional D.C. amplifier stage across the load resistors R11 and R12 at the collectors of transistors T3 and T4 respectively while the other end of said feedback resistors is connected to the emitter of the respective transistors T1 and T2. While the drawing shows only one pair of output stages with transistors T3 and T4, it is understood that they represent the output or final stage. Any number of stages depending upon the amount of amplification desired may be interposed between the input and output stages.

The operation of a typical embodiment of the invention will be more clearly understood if considered in connection with the following circuit values:

Transistor Type No. T1 and T2—2N35

$R1$=500 ohms
$R2$=500 ohms
$R3$=50,000 ohms
$R4$=50,000 ohms
$R5$=25,000 ohms
$R6$=50,000 ohms
$R7$=50,000 ohms
$R8$=50,000 ohms
$R9$=50,000 ohms
$R10$=50,000 ohms
$V1$=−24 volts
$V2$=+24 volts
$C1$=10 mf.

These values are given merely for illustrative purposes and are in no way to be considered as limiting the invention to circuits with the given parameters. Although the invention will operate satisfactorily with all types of transistors, silicon transistors are preferred when extremely wide temperature ranges are encountered because of their better high temperature stability.

It will be noted that each emitter of the input stage transistors T1 and T2 is returned separately to a degeneration resistor R5 which is common to both emitters, first through the relatively low feedback resistor R1, R2; then through a larger degeneration resistor R3, R4. Resistor R5 is variable for the purpose of adjusting the sum of the two collector currents of T1 and T2 to the desired value. The selection of large values for resistors R3 and R4 is for the purpose of effectively isolating the resistors R1 and R2 from each other for low frequency signals, thus permitting each emitter of transistors T1 and T2 to be independently subjected to a large amount of D.C. degeneration.

The purpose of capacitor C1 is to close-couple resistor R1 and R2 for high frequency signals and to prevent the degenerative effect of resistors R3 and R4 at higher frequencies. The value of C1 is selected to offer a low impedance compared to the sums of resistors R3 and R4 at a preselected band of frequencies, depending on the use of the amplifier.

Resistors R6 and R7 are conventional collector load resistances and their values are selected in conjunction with the balance potentiometer R8 to give the desired operating level of the transistors T1 and T2. The balance potentiometer R8 is provided to take care of any variations between the components of either side of the amplifier and in practice is adjusted to give equal quiescent collector voltages.

The values of resistors R9 and R10 are selected to provide the proper D.C. and A.C. voltage feedback ratio in conjunction with the resistors R1, R2, R3, R4 and the capacitor C1.

The operation of the invention can be more fully understood by considering the feedback ratios of the embodiment shown, utilizing components with the aforementioned illustrative values.

The D.C. feedback ratio $\beta_{DC}$ for each section can be computed by the following equation since the capacitor C1 is ineffective at D.C. voltages or low frequencies:

$$\beta_{DC}=\frac{R1+R3}{R9+R1+R3}=\frac{R2+R4}{R10+R2+R4}$$

for the values given $\beta_{DC}=0.49$ or approximately ½.

Similarly the A.C. feedback ratio $\beta_{AC}$ for each section can be computed by the following equation, since C1 is selected to offer a comparatively low impedance at higher frequencies:

$$\beta_{AC}=\frac{R1}{R1+R9}=\frac{R2}{R2+R10}=.0099\simeq.01$$

or approximately 1/100.

From the above feedback ratios and description, it is clearly demonstrated that each transistor T1, T2 of the input pair is independently subjected to a large amount of degenerative feedback which stabilizes the D.C. operating point of the input stages from the D.C. level of the output stage. The amount of degenerative feedback decreases with the increase of signal frequency until at high frequencies when the capacitor C1 effectively "shorts out" resistors R3 and R5, it asymptotically approaches the ratio shown above. The capacitor C1 is selected so that there is sufficient A.C. feedback at a predetermined band of frequencies to regulate the A.C. gain of the amplifier and maintain good in-phase rejection over the frequency range desired.

The operation of the amplifier shown in the figure is as follows:

An input signal $e_1$ is applied across input terminals 10 and 12 as shown. The transistors T1 and T2 each function as voltage amplifiers and each develop an output voltage across their respective load resistor R6 and R7. As previously mentioned, the potentiometer R8 was adjusted to give equal quiescent collector voltages while the variable resistor R5 was adjusted (thus setting the bias level of T1 and T2) to produce the desired magnitude of quiescent collector voltage. The adjustment of potentiometer R8 takes care of any unbalance in the two sections of the amplifiers due to variations in the transistors or other components. The output voltage of the T1 and T2 stages are further amplified by the additional D.C. amplifier stage. The number of additional stages depend on the amount of amplification required.

A portion of the output voltage of the last stage is fed back by means of resistors R9 and R10 to stages T1 and T2 respectively. In the event of a change in environmental conditions such as increase in temperature, the large amount of degenerative D.C. voltage feedback will effectively lock the D.C. voltage level of the output stage at a substantially constant value. For example, if the environmental temperature rises considerably, this will cause the operating points of the transistor T1 and T2 to drift up along their respective load lines and decrease the D.C. collector voltage of each. This in turn will increase the D.C. level of the output stage and raise the voltage fed back to the emitters of transistors T1 and T2, thus decreasing quiescent current and raising the output level of stages T1 and T2 to a point close to their former value.

Since each output is fed back independently to transistors T1 and T2 respectively, and the resistors R1 and R2 are effectively isolated from each other at low frequencies by the larger resistor R3 and R4, the operating point of each individual transistor of the input pair is servoed against the D.C. voltage level of the corresponding transistor of the output pair. In other words, if the D.C. level of the output stage should change due to environmental conditions such as changes in temperature or decreased battery supply voltage or other causes, the change results in the setting of the level of the bias applied to the transistor of the input pair at a level to maintain the D.C. voltage level of the output stage at a nearly constant value.

At the same time, a portion of the A.C. output voltage is similarly fed back through resistor R9 and R10 opposing the A.C. signal level in stages T1 and T2, thereby providing A.C. gain stability. If the A.C. gain decreases due to any factor, the level of the A.C. feedback signal is also reduced. The reduction of the feedback signal permits the A.C. output signal of transistors T1 and T2 to increase in magnitude, which in turn causes the output signal to increase, thereby maintaining gain stability of the amplifier.

As the frequency of the input signal is increased from zero, the amount of degeneration and feedback is changed with the corresponding change of impedance of C1. Consequently by selecting the value of the capacitor C1 and the resistors R1, R2, R3 and R5, R5, R9 and R10, the A.C. feedback ratio can be controlled to permit the gain of the amplifier at any desired frequency or band of frequencies to be a specified value and yet maintain the necessary D.C. feedback to keep the operating point of the amplifier stabilized.

Since this type of amplifier has a high common-mode rejection ratio, changes which produce the same effects in the upper and lower section cancel each other out. The application of feedback in the manner shown results in stabilizing each side of the amplifier to compensate for changes occuring within that section without impairing the common mode effect. Consequently, the amplifier described herein, when operated with silicon transistors, is capable of operating over an extremely wide range of temperature conditions with very little drift, making it suitable for use with quantitative devices. The amplifier can be built to have large A.C. gains without the sacrifice of stability with change in environmental conditions. In the above described amplifier, utilizing the parameters set forth, the amplifier had an A.C. gain of approximately 100 with a D.C. gain of 2.

Having set forth and described with particularity the best mode of the invention, it will be obvious to those skilled in the art that the circuit described herein is capable of various modifications within the spirit and scope of the invention and is to be taken as illustrative rather than limiting.

I claim:

1. A double ended amplifier comprising a plurality of cascaded stages, each stage consisting of a pair of transistors connected in symmetrical configuration, said transistors each including at least an emitter, a collector and a base element, the emitter of each transistor of said first stage connected together through two pairs of resistors in series, the first resistor of said resistor pairs connected to the emitter having a smaller resistance than the second resistor of said pair, the junction of said second resistors connected to a source of unidirectional potential, a capacitor connected to by-pass said second resistors of said pairs, an input signal applied between the base and ground of each transistor, the collectors of the transistors of said first stage each connected to a collector load resistance, the other end of said collector load resistances connected to a unidirectioned voltage source, output means connected across each of said collector load resistors to the input of the next succeeding stages and a degenerative direct feedback path including a resistor from the output of each transistor of the final stage connected to the emitter of the corresponding transistor in the first stage.

2. The amplifier of claim 1 wherein said first input stage includes means in said emitter circuits to set the bias level of the input stage and means in said collector circuits to adjust the collector currents of said stage.

3. A double ended amplifier consisting of a first transistor having at least an emitter, a collector and a base element, said emitter being connected to a first and second emitter resistor connected in series, said collector being connected to a collector resistor, a second transistor having at least an emitter, a collector and a base element, the emitter of the second transistor being connected to a third and fourth resistor connected in series, the collector of said second transistor being connected to a collector resistor, the opposite ends of said second and said fourth emitter resistors connected together to one end of a variable resistor, the other end of said variable resistor being connected to a first source of unidirectional voltage, a capacitor having one terminal connected to the junction of said first and second emitter resistors and the other terminal connected to the junction of said third and fourth emitter resistors, a first input signal applied between the base of said first transistor and ground, a second input signal applied between the base and ground of said second transistor, a potentiometer having its end terminals connected to the opposite ends of the collector resistors of said first and second transistors, the variable element of said potentiometer connected to a second source of unidirectional voltage, a symmetrical output stage having first and second output means, the first input of said output stage connected across the collector resistor of said first transistor, the second input of said output stage connected across the collector resistor of said second transistor, a first feedback resistor connected from the first output means of said output stage to the emitter of said first transistor and a second feedback resistor connected from the second output means of said output stage to the emitter of said second transistor whereby the feedback from said output stages is degeneratively applied to said first and second transistors.

4. An amplifier same as claim 3 wherein said third emitter resistor has substantially the same resistance as said first emitter resistor, and said fourth emitter resistor has substantially the same resistance as said second emitter resistor.

5. An amplifier same as claim 4 wherein the resistance of second and fourth emitter resistors is substantially greater than said first and third resistors.

6. An amplifier same as claim 5 wherein the values of said emitter resistors, said feedback resistors and said capacitor are such to provide large amounts of D.C. degenerative feedback while at the same time providing lesser amounts of A.C. degenerative feedback.

7. An amplifier same as claim 6 wherein the value of said components are selected to provide a reduced amount of A.C. feedback at a specific frequency while at the same time providing a large amount of D.C. feedback.

8. A balanced input differential amplifier for use with additional symmetrical amplifier stages comprising a pair of transistors each having at least an emitter, a collector and a base element, the emitters of said transistors being connected together through first, second, third and fourth emitter resistors connected in series, the junction of said second and third emitter resistors connected to a source of unidirectional potential, a capacitor connected across said second and third resistors, the collectors of said transistors connected through first and second collector resistors, the junction of said first and second collector resistors connected to a source of unidirectional potential, input signal means connected between the base elements and ground of said transistors, additional symmetrical amplifier stages connected in cascade having double ended input and output means, one of said input means connected across said first collector resistor, the other of said input means connected across said second collector resistor, a feedback resistor connected from one of said output means from the last stage to the junction of said transistor emitter and said first emitter resistor and a second feedback resistor connected from the other of said output means from the last stage to the junction of said transistor emitter and said fourth emitter resistor whereby the feedback from said output stages is degeneratively applied to said pair of transistors.

9. The amplifier of claim 8 wherein a variable resistor is provided connected to the junction of said second and third emitter resistor and said source of unidirectional potential to set the bias level of said transistors.

10. The amplifier of claim 9 wherein a potentiometer is connected between the other ends of said first and second collector resistor, and the variable element of said potentiometer is connected to said source of unidirectional potential to adjust the currents through said transistors.

11. The amplifier of claim 10 wherein the values of said emitter resistor, said capacitor and said feedback resistors are selected to provide large amounts of D.C. voltage feedback for said individual transistors of the input amplifier from the corresponding output of the final stage to maintain the D.C. level of said last stage at a constant value while at the same time providing a preselected amount of A.C. degenerative feedback.

12. The amplifier of claim 11 wherein the values of said emitter resistors, said capacitors and said feedback resistor are selected to provide large amounts of D.C. degenerative feedback and a lesser amount of A.C. degenerative feedback.

References Cited in the file of this patent

UNITED STATES PATENTS

| | | |
|---|---|---|
| 2,680,160 | Yaeger | June 1, 1954 |
| 2,750,456 | Waldhauer | June 12, 1956 |
| 2,761,917 | Aronson | Sept. 4, 1956 |
| 2,762,874 | Barco | Sept. 11, 1956 |
| 2,813,934 | Cibelius | Nov. 19, 1957 |
| 2,855,468 | Lohman | Oct. 7, 1958 |
| 2,863,008 | Keonjian | Dec. 2, 1958 |
| 2,900,456 | Davidson | Aug. 19, 1959 |
| 2,959,741 | Murray | Nov. 8, 1960 |

FOREIGN PATENTS

| | | |
|---|---|---|
| 164,875 | Australia | Aug. 30, 1955 |

OTHER REFERENCES

Peppercorn: "A High-Quality Transistor Receiver," Proc. IRE, Australia, December 1957, pages 457–462.